US011158779B1

(12) United States Patent
Kim et al.

(10) Patent No.: US 11,158,779 B1
(45) Date of Patent: Oct. 26, 2021

(54) THERMOELECTRIC MATERIAL AND THERMOELECTRIC DEVICE INCLUDING THE SAME

(71) Applicant: LG CHEM, LTD., Seoul (KR)

(72) Inventors: Jaehyun Kim, Daejeon (KR); Sujeong Lee, Daejeon (KR); Yeseul Lee, Daejeon (KR); Cheol Hee Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 197 days.

(21) Appl. No.: 16/623,262

(22) PCT Filed: May 8, 2019

(86) PCT No.: PCT/KR2019/005996
§ 371 (c)(1),
(2) Date: Dec. 16, 2019

(87) PCT Pub. No.: WO2019/240391
PCT Pub. Date: Dec. 19, 2019

(30) Foreign Application Priority Data

Jun. 11, 2018 (KR) .................. 10-2018-0066825

(51) Int. Cl.
*H01L 35/18* (2006.01)
*C22C 12/00* (2006.01)
*H01L 35/34* (2006.01)

(52) U.S. Cl.
CPC .............. *H01L 35/18* (2013.01); *C22C 12/00* (2013.01); *H01L 35/34* (2013.01)

(58) Field of Classification Search
CPC .......... H01L 35/18; H01L 35/34; C22C 12/00
See application file for complete search history.

(56) References Cited

U.S. PATENT DOCUMENTS

| | | | |
|---|---|---|---|
| 2010/0294326 A1* | 11/2010 | Guo | ................. B22F 7/08 136/238 |
| 2010/0319746 A1 | 12/2010 | Snyder et al. | |
| 2011/0036099 A1 | 2/2011 | Bari | |
| 2013/0323110 A1 | 12/2013 | Backhaus-Ricoult et al. | |
| 2016/0141481 A1 | 5/2016 | Morelli et al. | |
| 2018/0090656 A1* | 3/2018 | Min | .................. H01L 35/18 |
| 2018/0090856 A1 | 3/2018 | Min et al. | |

FOREIGN PATENT DOCUMENTS

| JP | 2002-33526 A | 1/2002 |
|---|---|---|
| JP | 4459400 B2 | 4/2010 |
| JP | 2011-510479 A | 3/2011 |

(Continued)

OTHER PUBLICATIONS

Elsheikh et al., "Microstructural Modification of $Co_4Sb_{12}$ Skutterudite Thermoelectnic Material Thwuch Al Exceed Doping", Science of Advanced Materials, Nov. 2016, vol. 8, No. 11, pp. 2121-2127(7).

(Continued)

*Primary Examiner* — C Melissa Koslow
(74) *Attorney, Agent, or Firm* — Birch, Stewart, Kolasch & Birch, LLP.

(57) ABSTRACT

A thermoelectric material which minimize the content of components that degrade thermoelectric performance and thus can be usefully used in thermoelectric devices including the same.

10 Claims, 1 Drawing Sheet

(56) References Cited

FOREIGN PATENT DOCUMENTS

| KR | 10-1316720 B1 | 10/2013 |
| KR | 10-2013-0122618 A | 11/2013 |
| KR | 10-1389755 B1 | 4/2014 |
| KR | 10-1469759 B1 | 12/2014 |
| KR | 10-2017-0082982 A | 7/2017 |
| KR | 10-1772392 B1 | 8/2017 |
| KR | 10-1799284 B1 | 11/2017 |
| KR | 10-2018-0057079 A | 5/2018 |
| WO | WO 2009/093455 A1 | 7/2009 |
| WO | WO 2017/082578 A1 | 5/2017 |

OTHER PUBLICATIONS

Elsheikh et al., "Rapid preparation of bulk $Al_x Yb_{0.25}Co_4Sb_{12}$ (x=0, 0.1,0.2,0.3) skutterudite thermoelectric materials with high figure of merit ZT=1.36", Journal of Mater Science, 2017, vol. 52, Issue 9, pp. 5324-5332.
Extended European Search Report, dated Apr. 8, 2020, for European Application No. 19819747.7.

* cited by examiner

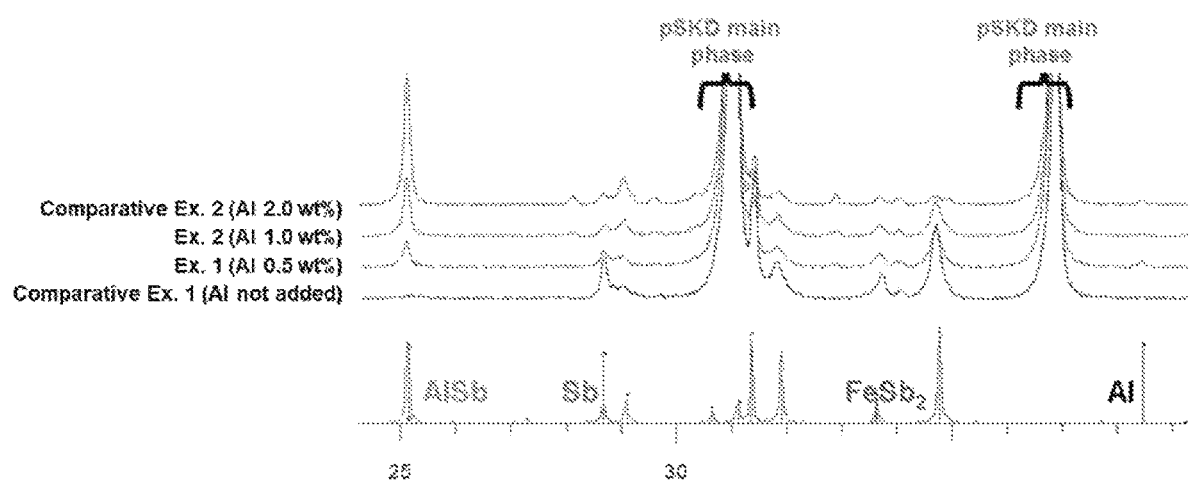

THERMOELECTRIC MATERIAL AND THERMOELECTRIC DEVICE INCLUDING THE SAME

CROSS-REFERENCE TO RELATED APPLICATION(S)

This application claims the benefit of the filing date of Korean Patent Application No. 10-2018-0066825 filed with the Korean Intellectual Property Office on Jun. 11, 2018, the entire content of which is incorporated herein by reference.

TECHNICAL FIELD

The present invention relates to a thermoelectric material minimizing the content of components that degrade thermoelectric performance, and a thermoelectric device including the same.

BACKGROUND ART

Recently, with interest in the development and saving of alternative energy being heightened, investigation and research on efficient energy conversion materials are actively conducted. In particular, research on thermoelectric materials, which are thermoelectric energy conversion materials, is being accelerated.

These thermoelectric materials are metal or ceramic materials having a function to directly convert heat to electricity or inversely convert electricity to heat, and have the advantage that power can be generated even in the absence of moving parts when a temperature difference is applied. After the discovery of their thermoelectric phenomena, namely Seebeck effect, Peltier effect, and Thomson effect at the beginning of the 19th century, these thermoelectric materials have been developed so as to have a high thermoelectric performance index as semiconductors have progressed since the late 1930s.

Meanwhile, as next-generation materials having thermoelectric energy conversion characteristics, skutterudite compounds are researched. Skutterudite compounds have abundant potential as materials that are expected to improve their thermoelectric energy conversion characteristics by the decrease of lattice thermal conductivity.

Meanwhile, a method for producing a thermoelectric material containing skutterudite generally includes three stages, wherein a raw material is first heated under various conditions in accordance with the chemical composition of the target thermoelectric material, and subjected to heat treatment to synthesize an ingot-shaped material. This is pulverized and classified to produce a powder, which is then sintered at high temperature and high pressure to produce a thermoelectric material.

By the way, the production method including the synthesis, pulverization, classification and sintering as described above is expensive to apply in a continuous process, and therefore, in the industrial production, in consideration of economic efficiency, the thermoelectric material powder is first mass-produced as described above, and subsequently, the powder is sintered to produce the thermoelectric material. In other words, the production process of the powder is more economical as mass production becomes possible, and the sintering process of the powder has a long process time due to the high temperature process characteristics. Thus, it takes a considerable amount of time between the powder mass production process and the sintering process and therefore inevitably stores the powder for a long time.

Meanwhile, the present inventors have found that the performance of the thermoelectric material finally produced greatly depends on the storage conditions of the skutterudite powder produced by the above-mentioned method. In particular, as described in detail below, it has been confirmed that materials that degrade the performance of the thermoelectric material are found in the thermoelectric material produced while the skutterudite powder is stored for a long time.

In this regard, the present inventors have conducted an intensive research on a method for preventing the performance of the thermoelectric material from degrading even when producing the thermoelectric material after the powder is stored for a long time as described above, and as a result, have found that when using the thermoelectric material and the production method thereof as described below, the above-mentioned problems are solved, thereby completing the present invention.

DETAILED DESCRIPTION OF THE INVENTION

Technical Problem

It is an object of the present invention to provide a thermoelectric material minimizing the content of components that degrade thermoelectric performance, and a thermoelectric element including the thermoelectric material.

Technical Solution

In order to achieve that above objects, one embodiment of the present invention provides a thermoelectric material comprising a p-type skutterudite material of the following Chemical Formula 1, AlSb in an amount greater than 0 wt % and 7.5 wt % or less relative to a total amount of the thermoelectric material, and $FeSb_2$ in an amount greater than 0 wt % and 20 wt % or less of relative to a total amount of the thermoelectric material:

$$(M)_m(Fe)_a(A')_{a'}(Co)_b(B')_{b'}(Sb)_c(C')_{c'}$$ [Chemical Formula 1]

wherein, in Chemical Formula 1,

M is at least one of element selected from the group consisting of S, In, Nd, Pr, Ce, Yb, La, Sr, Ba, Ca, Sm, Eu, and Gd, $0 < m < 1.5$, A' is at least one of element selected from the group consisting of Ni, Mn, Tc, and Pd, $1 < (a+a') \le 4$, and $0 \le a' < 1$, B' is at least one of element selected from the group consisting of Ni, Ru, Os, Ir, and Pt, $0 < (b+b') < 3$, and $0 \le b' < 1$, C' is at least one of element selected from the group consisting of Sn and Te, and $11 < (c+c') < 13.5$, and $0 \le c' < 1$.

As used herein, the term 'p-type skutterudite material' refers to a compound represented by Chemical Formula 1 as defined above, and corresponds to a main component of a thermoelectric material in the present invention.

The p-type skutterudite-based thermoelectric materials as described above is generally produced by a method for producing the thermoelectric materials including the steps of heating raw materials under various conditions in accordance with the chemical composition, subjecting them to heat treatment to produce an ingot-shaped material, pulverizing and classifying the resultant material to produce a powder, and then sintering the powder at high temperature and high pressure. In industrial production, the skutterudite material is produced by mass-producing the powder and then sintering it for economic reasons. In this process, sintering is proceeded after the powder is stored for a long time. The long-term storage causes a problem that the performance of the thermoelectric material is greatly deteriorated.

In particular, the "p-type skutterudite" of the present invention contains Fe and Sb elements. Although not theoretically limited, the performance degradation of the thermoelectric material as described above is attributable to the generation of $FeSb_2$ due to long-term storage, as in the Examples and Comparative Examples of the present invention. In addition, the "p-type skutterudite" of the present invention also contains Co element, and thus the $FeSb_2$ may also exist in the form of $(Fe/Co)Sb_2$. Therefore, $FeSb_2$ described herein means also including $(Fe/Co)Sb_2$.

Therefore, according to the present invention, in the production of the thermoelectric material, a small amount of Al is added and sintered together during the sintering of p-type skutterudite powder, and thereby a small amount of AlSb is generated in the thermoelectric material. As a result, it is possible to reduce the generation of $FeSb_2$ which degrades the performance of a thermoelectric material.

Preferably, m is 0.5 to 1.0. Also, preferably, the M is Nd.
The a is preferably $2 \leq a \leq 4$, and most preferably 3.
The b is preferably $0.5 \leq b \leq 2$, and most preferably 1.
The c is preferably $11.5 \leq c \leq 12.5$, and most preferably 12.
The a', b', and c' mean the amounts of elements that are substituted and entered into Fe, Co, and Sb sites, respectively. The a', b', and c' are each less than 1, and when a', b', and c' are 0, it means that there is no element substituted.

Meanwhile, the content of the AlSb and $FeSb_2$ mean being based on the total mass of the thermoelectric material described above. For example, when AlSb and $FeSb_2$ are respectively included at 5 wt %, it means that the thermoelectric material contains 5 wt % of AlSb, 5 wt % of $FeSb_2$, and 90 wt % of the p-type skutterudite material. In one embodiment, the AlSb is contained in an amount of 1 wt % to 5 wt %. In one embodiment, the $FeSb_2$ is contained in an amount of 5 wt % to 15 wt %.

As described below, the AlSb is generated by adding Al during the production of the thermoelectric material, and is contained in an amount of greater than 0 wt % and 7.5 wt % or less in the thermoelectric material of the present invention. Although not theoretically limited, as Al is sintered together, Al and Sb are combined to form AlSb, and thereby, the generation of $FeSb_2$ is suppressed and as a result, it is possible to prevent the performance of the thermoelectric material from deteriorating.

As the generation of AlSb increases, the generation of $FeSb_2$ lowers, and as the generation amount of AlSb increases, the performance of the thermoelectric material is improved. However, when the generation amount of AlSb is excessively large, the performance of the thermoelectric material is deteriorated. Therefore, preferably, the generation amount of AlSb is preferably 7.0 wt % or less, 6.5 wt % or less, 5.0 wt % or less, 4.5 wt % or less, or 4.0 wt % or less in the thermoelectric material. Further, preferably, the generation amount of AlSb is 0.5 wt % or more, 1.0 wt % or more, or 1.5 wt % or more in the thermoelectric material.

As AlSb is generated, the generation amount of $FeSb_2$ decreases. Preferably, it is 20 wt % or less, 19 wt % or less, 18 wt % or less, 17 wt % or less, 16 wt % or less, 15 wt % or less, 14 wt % or less, 13 wt % or less, or 12 wt % or less in the thermoelectric material.

Another embodiment of the present invention provides a method for producing the thermoelectric material described above, comprising the steps of:
1) mixing M, Fe, A', Co, B', Sb, and C' at a molar ratio of m:a:a':b:b':c:c", and then heating and heat-treating the mixture to produce an ingot;
2) pulverizing the ingot produced above to produce a pulverized powder; and
3) mixing the pulverized powder with an Al powder, wherein an amount of the Al powder is greater than 0 wt % and 1.5 wt % or less relative to a total weight of the pulverized powder and then sintering the resulting mixture:
wherein M, A', B', C', m, a, a', b, b', c and c' are as defined above.

Step 1 is a step of mixing the components of the thermoelectric material and heating and heat-treating the mixture to produce an ingot.

Preferably, the heating temperature is 600 to 1400° C. Preferably, the heating time is 10 to 200 hours. Preferably, the heat treatment temperature is 500 to 800° C. Preferably, the heat treatment time is 10 to 200 hours. Thereby, the components of the thermoelectric material are finally melted to prepare an ingot-shaped material.

Step 2 is a step of pulverizing the ingot produced in step 1 to produce a powder.

The powder may be pulverized so as to have a particle size of 100 μm or less, and a classification step may be added as necessary. As the pulverization/classification method and apparatus therefor, the methods and apparatuses used in the field of inorganic materials can be applied without limitation.

Step 3 is a step of sintering the pulverized powder produced in step 2.

As described above, step 2 and step 3 are difficult to apply in a continuous process, in industrial production, and therefore, a thermoelectric material is produced by mass-producing a powder as in steps 1 and 2, and then sintering the powder as in step 3. This greatly affects the performance of the thermoelectric material depending on the conditions under which the powder is stored between step 2 and step 3.

However, in the present invention, by adding Al to the powder and sintering together as in step 3, it is possible to minimize the content of components that degrade performance in the thermoelectric material.

The addition amount of Al is a factor for determining the content of AlSb and $FeSb_2$ in the above-mentioned thermoelectric material. Therefore, by adjusting the addition amount of Al, it is possible to adjust the content of AlSb and $FeSb_2$. Preferably, the addition amount of Al is 0.1 wt % or more, 0.2 wt % or more, 0.3 wt % or more, 0.4 wt % or more, or 0.5 wt % or more, and 1.4 wt % or less, 1.3 wt % or less, 1.2 wt % or less, 1.1 wt % or less, or 1.0 wt % or less, relative to the powder produced in step 2. In one embodiment, the addition amount of Al is 0.5 wt % to 1.0 wt % relative to the pulverized powder.

The sintering may be carried out at a temperature of about 500 to 900° C. using a spark plasma sintering. Preferably the sintering temperature is 600 to 680° C. In addition, the sintering time is preferably 1 minute to 600 minutes at a pressure of 0.1 to 100 MPa.

Still another embodiment of the present invention provides a thermoelectric device comprising the above-mentioned thermoelectric material.

Advantageous Effects

As described above, the thermoelectric material according to the present invention minimizes the content of components that degrade thermoelectric performance and thus can be usefully used for thermoelectric devices including the same.

BRIEF DESCRIPTION OF THE DRAWINGS

The FIGURE shows an XRD graph of thermoelectric materials produced in Examples and Comparative Examples according to the present disclosure.

DETAILED DESCRIPTION OF THE EMBODIMENTS

Hereinafter, preferred examples are provided to facilitate understanding of the present invention. However, the following examples are merely provided for a better understanding of the present invention, and the scope of the present invention is not limited thereto.

Comparative Example 1

(Step 1)

High purity raw materials, Nd, Fe, Co and Sb were weighed in a glove box at a molar ratio of 0.9:3.0:1.0:12.1, put into a graphite crucible and then charged into a quartz tube. In the case of Sb, it was added by a molar ratio of 0.1 for volatilization. The inside of the quartz tube was sealed in a vacuum state. Then, the raw material was heated at 1000 to 1200° C. and kept constant temperature state in the furnace for 24 hours. Next, the quartz tube was naturally cooled to room temperature to form an ingot, which was then again kept constant temperature state in a furnace at 600 to 750° C. for 120 hours and subjected to heat treatment. The heat-treated ingot material was pulverized and classified into a powder having a particle size of 75 μm or less.

(Step 2)

The powder produced in step 1 was stored in a glove box with an oxygen concentration of 1 ppm or less for 6 months.

(Step 3)

7 g of the powder produced in step 2 was put into a 0.5-inch SUS mold and cold-pressed at a pressure of 0.5 to 1 ton to prepare a pSKD pellet. The prepared pellet was put into a 0.5-inch carbon mold and subjected to a high-temperature pressurization at 650° C. and 50 MPa for 10 minutes through a spark plasma sintering (SPS) device to prepare a 0.5-inch pSKD sintered body.

Example 1

Powders were prepared in the same manner as in steps 1 and 2 of Comparative Example 1. 0.5 wt % of Al was mixed with 7 g of the powder. This was put into 0.5-inch sus-mold and cold-pressed at 0.5 to 1 ton to prepare a pSKD pellet. The prepared pellet was put into a 0.5-inch carbon mold and subjected to a high-temperature pressurization at 650° C. and 50 Mpa for 10 minutes through a Spark plasma sintering (SPS) device to produce a 0.5-inch pSKD sintered body.

Example 2

The pSKD sintered body was produced in the same method as in Example 1, except that 1.0 wt % of Al was used instead of 0.5 wt % of Al.

Comparative Example 2

The pSKD sintered body was produced in the same method as in Example 1, except that 2.0 wt % of Al is used instead of 0.5 wt % of Al in step 3 of Example 1.

Experimental Example 1: XRD Analysis

The phases of the P-type skutterudite thermoelectric materials prepared in Examples and Comparative Examples were analyzed by an X-ray diffractometer (XRD) and the results are shown in the FIGURE.

As shown in the FIGURE, AlSb was not observed in the case of Comparative Example 1 in which Al was not added. Further, it was confirmed that the degree of generation of $FeSb_2$ was lowered depending on the degree of addition of Al.

Meanwhile, after XRD measurement, the composition and content of the chemical materials included were calculated through Rietveld refinement (RWP<10), and the results are shown in Table 1 below.

Experimental Example 2: Performance Evaluation of Thermoelectric Materials

The sintered bodies produced in the Examples and Comparative Examples were processed into right-angled columns having a size of 3 mm×3 mm×12 mmH, and then electrical conductivity (EC) and Seebeck coefficient (S) were measured using ZEM3 (Ulbac) and LSR3 (Linseis) instruments. For comparison of the representative values of electrical characteristics, the comparative evaluation was performed by calculating the average values of the measurement evaluations at 100, 200, 300, 400, and 500° C.

In addition, the sintered bodies produced in the Examples and Comparative Examples were processed into a round column with a size of 2 mmT×0.5 inch D, and the thermal diffusivity was evaluated using a LFA457 (Netzsch) instrument. The thermal conductivity (TC) was calculated from the measured thermal diffusivity, the apparent density of each sintered body, and the specific heat calculated by Dulong-Petit law. For comparison of the representative values of the heat transfer characteristics, a comparative evaluation was performed by calculating the average value of the thermal conductivity measurement evaluations at 100, 200, 300, 400, and 500° C.

The measurement results are shown in Table 1 below.

TABLE 1

| | Addition amount of Al | Composition | EC ($Scm^{-1}$) | S ($\mu VK^{-1}$) | PF ($\mu Wcm^{-1}K^{-2}$) | TC ($Wm^{-1}K^{-1}$) | ZT |
|---|---|---|---|---|---|---|---|
| Comparative Ex. 1 | (Not added) | $Nd_{0.9}Fe_{3.0}Co_{1.0}Sb_{12}$<br>$FeSb_2$ 19.8 wt %<br>AlSb 0 wt % | 1162 | 112.3 | 14.58 | 2.76 | 0.306 |
| Ex. 1 | 0.5 wt % | $Nd_{0.9}Fe_{3.0}Co_{1.0}Sb_{12}$<br>$FeSb_2$ 12 wt %<br>AlSb 1.8 wt % | 1090 | 125.7 | 17.13 | 2.51 | 0.394 |

TABLE 1-continued

| | Addition amount of Al | Composition | EC (Scm$^{-1}$) | S (μVK$^{-1}$) | PF (μWcm$^{-1}$K$^{-2}$) | TC (Wm$^{-1}$K$^{-1}$) | ZT |
|---|---|---|---|---|---|---|---|
| Ex. 2 | 1.0 wt % | Nd$_{0.9}$Fe$_{3.0}$Co$_{1.0}$Sb$_{12}$ FeSb$_2$ 10 wt % AlSb 4.0 wt % | 1063 | 128.1 | 17.35 | 2.46 | 0.410 |
| Comparative Ex. 2 | 2.0 wt % | Nd$_{0.9}$Fe$_{3.0}$Co$_{1.0}$Sb$_{12}$ FeSb$_2$ 3.7 wt % AlSb 9.7 wt % | 1224 | 118.5 | 17.03 | 2.81 | 0.355 |

As shown in Table 1, as the addition amount of Al increased, the generation amount of FeSb2 showed a decreasing tendency and the generation amount of AlSb showed an increasing tendency.

In addition, as shown in Examples 1 and 2, when the addition amount of Al was 0.5 wt % and 1.0 wt %, the thermoelectric material performance showed an increasing tendency. However, when the addition amount of Al was 2.0 wt % as in Comparative Example 2, the thermoelectric material performance was reduced, such as a decrease in the ZT coefficient. This is not limited in theory, but it is believed that the generation of AlSb increases which thus adversely affects the thermoelectric material.

The invention claimed is:

1. A thermoelectric material comprising:
   a p-type skutterudite material of the following Chemical Formula 1,
   AlSb in an amount greater than 0 wt % and 7.5 wt % or less relative to a total amount of the thermoelectric material, and
   FeSb$_2$ in an amount greater than 0 wt % and 20 wt % or less relative to the total amount of the thermoelectric material:

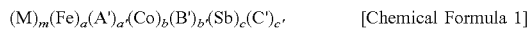
   $(M)_m(Fe)_a(A')_{a'}(Co)_b(B')_{b'}(Sb)_c(C')_{c'}$      [Chemical Formula 1]

wherein, in Chemical Formula 1,
   M is at least one element selected from the group consisting of S, In, Nd, Pr, Ce, Yb, La, Sr, Ba, Ca, Sm, Eu, and Gd, $0 < m < 1.5$, A' is at least one element selected from the group consisting of Ni, Mn, Tc, and Pd, $1 < (a+a') \leq 4$, and $0 \leq a' < 1$, B' is at least one element selected from the group consisting of Ni, Ru, Os, Ir, and Pt, $0 < (b+b') < 3$, and $0 \leq b' < 1$, C' is at least one element selected from the group consisting of Sn and Te, and $11 < (c+c') < 13.5$, and $0 \leq c' < 1$.

2. The thermoelectric material according to claim 1, wherein
   the m is 0.5 to 1.0.

3. The thermoelectric material according to claim 1, wherein
   the amount of AlSb is 1 wt % to 5 wt % relative to the total amount of the thermoelectric material.

4. The thermoelectric material according to claim 1, wherein
   the amount of FeSb$_2$ is 5 wt % to 15 wt % relative to the total amount of the thermoelectric material.

5. A method for producing the thermoelectric material of claim 1, the method comprising the steps of:
   1) mixing M, Fe, A', Co, B', Sb, and C' at a molar ratio of m:a:a':b:b':c:c', and then heating and heat-treating the mixture to produce an ingot;
   2) pulverizing the ingot produced above to produce a pulverized powder; and
   3) mixing the pulverized powder with an Al powder wherein an amount of the Al powder is greater than 0 wt % and 1.5 wt % or less relative to a total weight of the pulverized powder and then sintering the resulting mixture;
   wherein M, A', B', C', m, a, a', b, b', c and c' are as defined in claim 1.

6. The method of claim 5, wherein
   a temperature of the heating of step 1 is 600° C. to 1400° C.

7. The method of claim 5, wherein
   a temperature of the heat-treating of step 1 is 500° C. to 800° C.

8. The method of claim 5, wherein
   the amount of Al powder in the step 3 is 0.5 wt % to 1.0 wt % relative to the total weight of the pulverized powder.

9. The method of claim 5, wherein
   the sintering is cared out at a temperature of 500° C. to 900° C.

10. A thermoelectric device comprising the thermoelectric material of claim 1.

* * * * *